United States Patent [19]
Lee et al.

[11] Patent Number: 5,982,007
[45] Date of Patent: Nov. 9, 1999

[54] SEMICONDUCTOR MEMORY DEVICE

[75] Inventors: Soo-Cheol Lee, Seoul; Gyeong-Hee Kim, Yongin-gun, both of Rep. of Korea

[73] Assignee: Samsung Electronics Co., Ltd., Suwon-city, Rep. of Korea

[21] Appl. No.: 08/896,946

[22] Filed: Jul. 18, 1997

[30] Foreign Application Priority Data

Jul. 19, 1996 [KR] Rep. of Korea ................. 96-29030

[51] Int. Cl.$^6$ .......................... H01L 23/62; H01L 29/00
[52] U.S. Cl. ..................... 257/362; 257/355; 257/546
[58] Field of Search ................................ 257/362, 546, 257/547, 548, 355, 356, 357, 358, 359, 360, 361, 363, 173; 361/90

[56] References Cited

U.S. PATENT DOCUMENTS

| | | |
|---|---|---|
| 4,712,152 | 12/1987 | Iio ............................................. 361/56 |
| 5,181,091 | 1/1993 | Harrington, III et al. ............ 257/355 |
| 5,684,321 | 11/1997 | Okamura ................................ 257/357 |

FOREIGN PATENT DOCUMENTS 000226469  6/1987  European Pat. Off. ............... 257/546

*Primary Examiner*—Tom Thomas
*Assistant Examiner*—Ori Nadav
*Attorney, Agent, or Firm*—Jones Volentine, L.L.P.

[57] ABSTRACT

A semiconductor memory device is provided for preventing loss of cell data and reduction of a standby current. The semiconductor memory device includes a first conductivity type semiconductor substrate connected to a ground voltage, a first well region of second conductivity type formed over the semiconductor substrate and connected to the ground voltage, a second well region of the first conductivity type embedded in the first well region, a first impurity region of the second conductivity type embedded in the second well region and connected to an input/output pad, and one or more additional impurity regions embedded in the second well region separately from the first impurity region, the one or more additional impurity regions being connected to the ground voltage.

4 Claims, 5 Drawing Sheets

SEMICONDUCTOR MEMORY DEVICE

BACKGROUND OF THE INVENTION

The present invention concerns a semiconductor memory device with means for preventing standby current and cell data, wherein input and output signal are stored and read through an input/output pad electrically connected with the n$^+$ impurity doped region of the semiconductor substrate. The present application is based upon Korean Application No. 96-29030, which is incorporated herein by reference.

Recently, as semiconductor memory devices have been developed to have a high operational speed, undershoot is generated in an input/output signal. This causes an unwanted current to flow through the n$^+$ impurity doped region connected with the input/output pad while being diffused or drifted into the memory cell arrays of the device.

Unfortunately, this unwanted injection of electrons into the n$^+$ region can destroy the memory cell data.

FIG. 1 is a cross sectional view illustrating a first conventional semiconductor memory device. As shown in FIG. 1, a first p-type well 102, an n-type well 103, and a second p-type well 104 are each formed on different portions of a p-type semiconductor substrate 101. A first n$^+$ doped impurity region 105 is embedded in the first p-type well 102 and is connected with an input/output pad 110. A second n$^+$ impurity doped region 106 and a p$^+$ impurity doped region 107 are embedded in the first p-type well 102, separate from the n$^+$ impurity doped region 105. Both the second n$^+$ impurity doped region 106 and the p$^+$ impurity doped region 107 are connected with ground voltage $V_{SS}$.

A third n$^+$ impurity doped region 108 is embedded in the n-type well 103 and is connected to a source voltage $V_{CC}$. A fourth embedded n$^+$ impurity doped region 109 is embedded in the second p-type well 104 and is connected with the cell node.

In the conventional memory device shown above, when undershoot is generated due to the swing of the input/output signal inputting to the input/output pad 110, the diode of the first p-type well 102 is grounded and the first n$^+$ impurity doped region 105 connected to the input/output pad 110 is forward biased.

FIG. 2 is a view illustrating an equivalent circuit of the semiconductor memory device of FIG. 1. As shown in FIG. 2, a forward bias is applied to the impurity doped region connected with the p-type semiconductor substrate 101 and the cell node. Thus, a part of the electrons injected from the first n$^+$ impurity doped region 105 into the first p-type well 102 is transferred through the second n$^+$ region 106 and the p$^+$ region 107 to ground (path 100A in FIGS. 1 and 2). Most electrons are actually diffused into the p-type semiconductor substrate 101. Some of the electrons are is discharged through the n-type well 103 connected with the source voltage $V_{CC}$ (path 100B in FIGS. 1 and 2). The remaining electrons flow into the memory cell array, however, thus changing the cell data (path 100C in FIGS. 1 and 2).

The drawbacks of the conventional memory device are caused by the current paths 100B and 100C. The electrons travelling along current path 100B through the n-type well 103 can cause an operational failure as a standby current $I_{sb}$. The electrons travelling along current path 100C into the fourth n$^+$ impurity doped region 110 can lower the voltage of the cell node and thus destroy the cell data.

FIG. 3 is a cross sectional view illustrating a second conventional semiconductor memory device. As shown in FIG. 3, a first p-type well 202, an n-type well 203, and a second p-type well 204 are each formed on different portions of a p-type semiconductor substrate 201. A first n$^+$ doped impurity region 205 is embedded in the first p-type well 202 and is connected with an input/output pad 110. A second n$^+$ impurity doped region 206 and a p$^+$ impurity doped region 207 are embedded in the first p-type well 202, separate from the n$^+$ impurity doped region 205. Both the second n$^+$ impurity doped region 206 and the p$^+$ impurity doped region 207 are connected with ground voltage $V_{SS}$.

A third n$^+$ impurity doped region 208 is embedded in the n-type well 203 and is connected to a source voltage $V_{CC}$. A fourth embedded n$^+$ impurity doped region 209 is embedded in the second p-type well 204 and is connected with the cell node.

The semiconductor memory device of FIG. 3 differs from the semiconductor device of FIG. 1 in that the n-type well 203 extends under the first p-type well 202 to insulate the first p-type well from the p-type substrate 201. In this way, the n-type well 203 acts to protect the device from electrostatic charges by reducing the current path 200C from the input/output pad 110 to the cell node. Thus the current 200C in the second conventional semiconductor memory device is less than the current 100C in the first conventional semiconductor memory device.

FIG. 4 is a view illustrating an equivalent circuit of the semiconductor memory device as shown in FIG. 3. As shown in FIGS. 3 and 4, the current path 200C allows unwanted electrons to pass to the cell node and may cause a loss of data. However, in this device, the n-type well 203 and the first p-type well 202 are turned off in a reversely biased state, which blocks the flow of the electrons from the input/output pad to the cell node, minimizing the current along current path 100C. Thus, when undershoot is generated in an input/output signal entering the input/output pad 110, the diode of the first n$^+$ impurity doped region 205 in the first p-type well 202 is forward biased, causing most electrons to flow into the first p-type well 202. A part of the electrons flowing into the first p-type well 202 is discharged through the path 200A to ground, but most of the remaining electrons flow into the n-type well 203 along current path 200B, i.e., as standby current $I_{sb}$. Since the n-type well 203 and the p-type semiconductor substrate 201 are at this point reversely biased, the electrons are discharged to the source voltage $V_{CC}$ terminal through the path 200B instead of passing through the second p-type semiconductor substrate 204. This prevents a loss of data at the cell node and can reduce the standby current, $I_{sb}$.

SUMMARY OF THE INVENTION

It is an object of the present invention to provide a semiconductor memory device for preventing loss of cell data and standby current. It is another object of the present invention to provide a semiconductor memory device for increasing the data processing speed and ensuring the reliability of the chip.

According to the present invention, a semiconductor memory device comprises: a first conductivity type semiconductor substrate connected to a ground voltage; a first well region of second conductivity type formed over the semiconductor substrate and connected to the ground voltage; a second well region of the first conductivity type embedded in the first well region; a first impurity region of the second conductivity type embedded in the second well region and connected to an input/output pad; and one or more additional impurity regions embedded in the second well region separately from the first impurity region the one or more additional impurity regions being connected to the ground voltage.

The first conductivity type may be a p-type impurity, and the second conductivity type may be an n-type impurity. The one or more additional regions may include a second impurity region of the first conductivity type and a third impurity region of the second conductivity type.

The a first well region and the one or more additional impurity regions may also all be connected to a source voltage instead of a ground voltage.

The present invention will now be described more specifically with reference to the drawings attached only by way of example.

BRIEF DESCRIPTION OF THE ATTACHED DRAWINGS

A more complete appreciation of this invention, and many of the attendant advantages thereof, will be readily apparent with reference to the following detailed description when considered in conjunction with the accompanying drawings, in which like reference symbols indicate the same or similar components, wherein.

DETAILED DESCRIPTION OF THE PREFERRED EMBODIMENT

Figure 1:
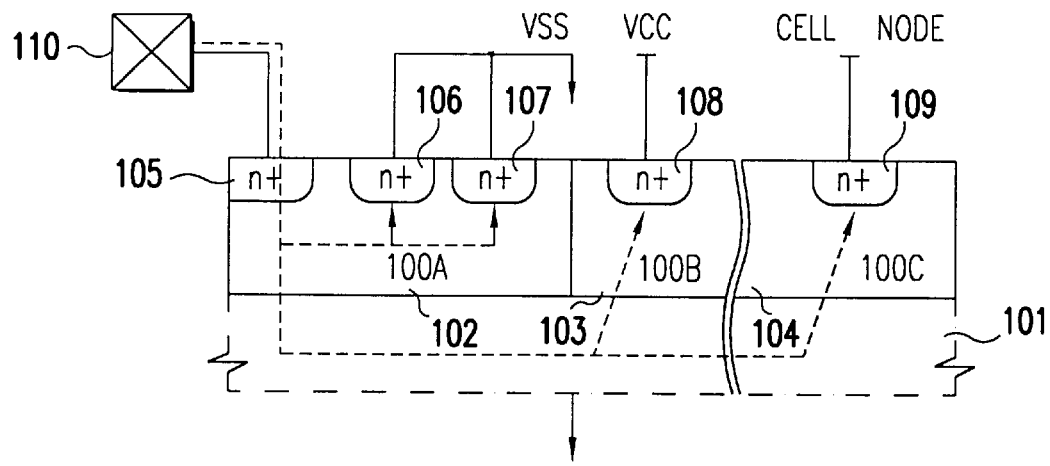
FIG. 1 is a cross sectional view illustrating a first conventional semiconductor memory device.
Figure 2:
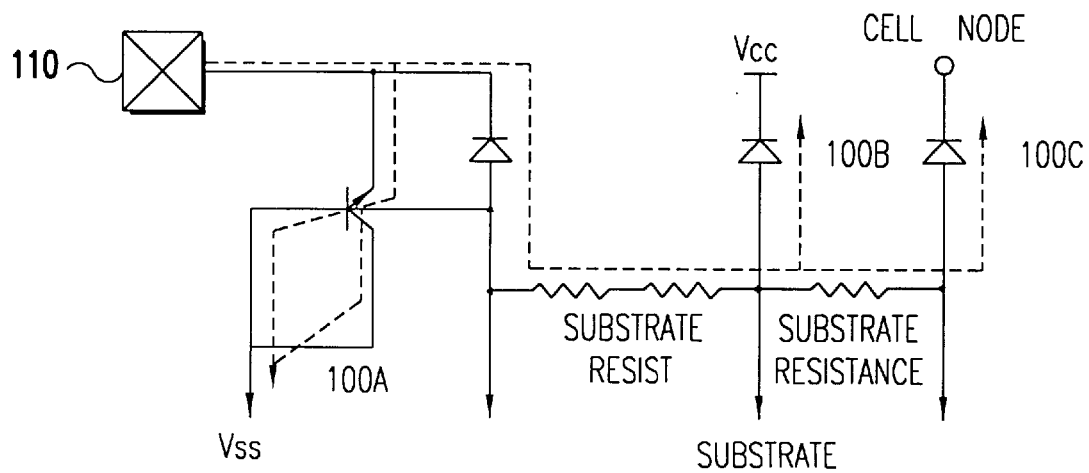
FIG. 2 is a view illustrating an equivalent circuit of the semiconductor memory device as shown in FIG. 1.
Figure 3:
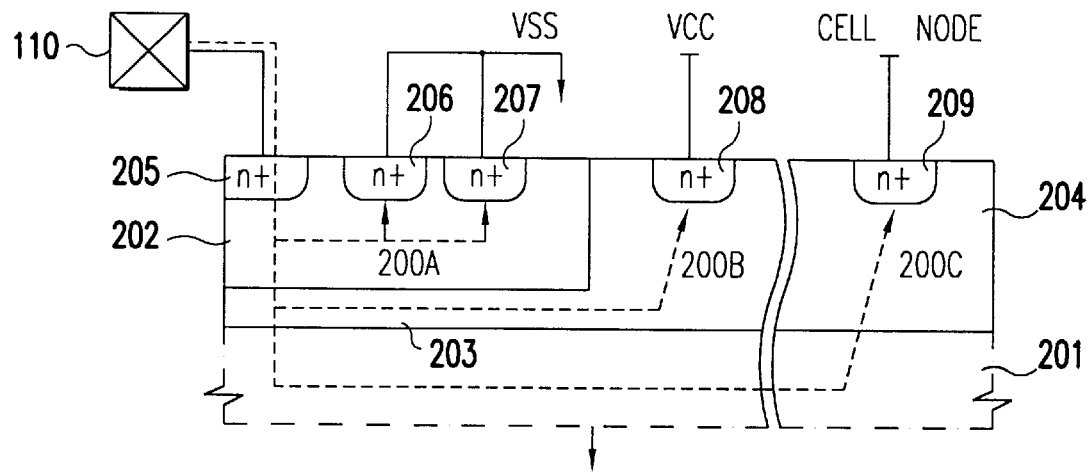
FIG. 3 is a cross sectional view illustrating a second conventional semiconductor memory device.
Figure 4:
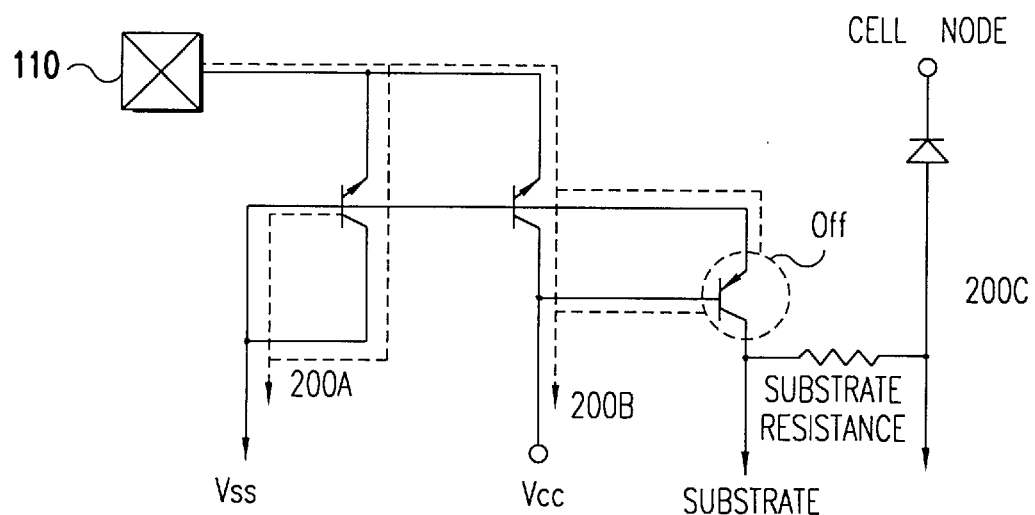
FIG. 4 is a view illustrating an equivalent circuit of the semiconductor memory device shown in FIG. 3.

Throughout the drawings, it is noted that the same reference numerals of letter will be used to designate like or equivalent elements having the same function. Furthermore, in the following description, specific details regarding preferred components comprising the circuit are set forth to provide a more thorough understanding of the present invention. It will be apparent, however, to one skilled in the art that the present invention is not limited to the specific preferred embodiment described below.

Figure 5:
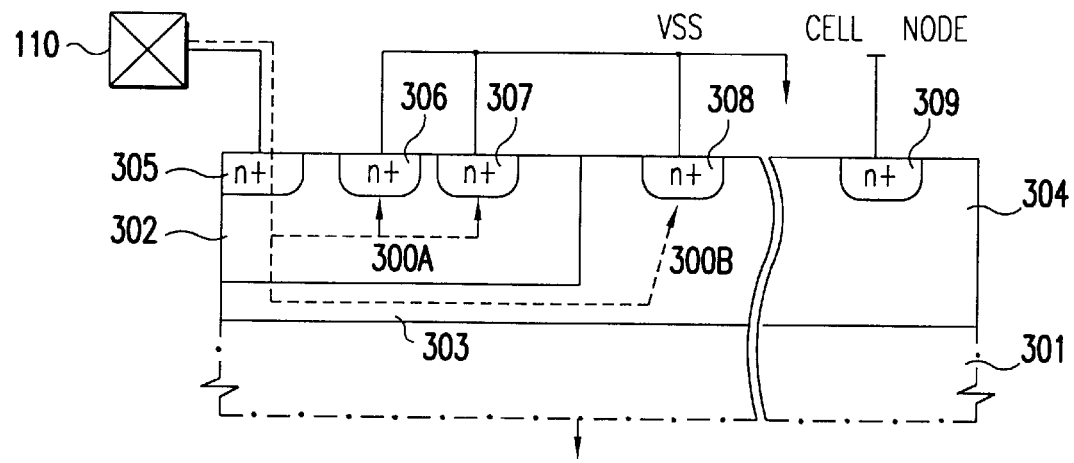
FIG. 5 is a cross sectional view illustrating a semiconductor memory device according to a preferred embodiment of the present invention.
Figure 6:
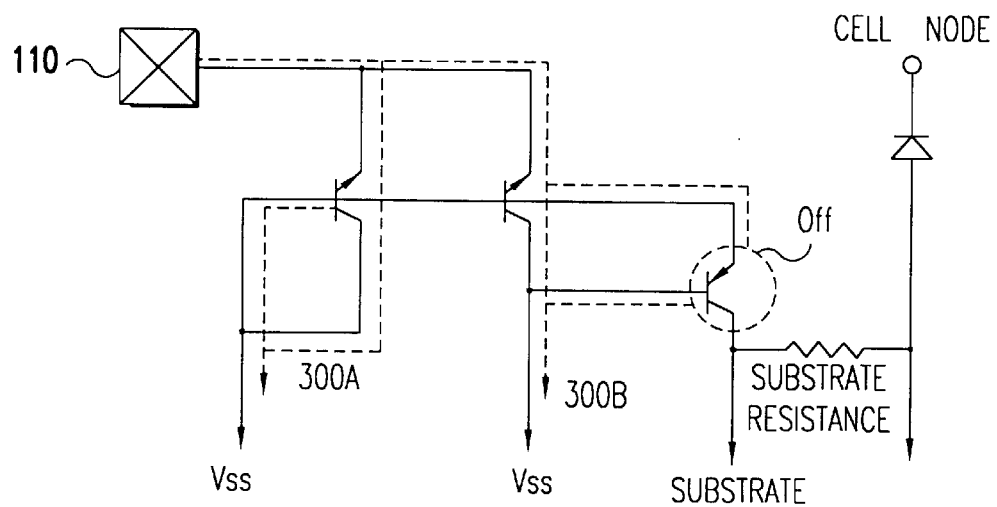
FIG. 6 is a view illustrating an equivalent circuit of the semiconductor memory device as shown in FIG. 5.

FIG. 5 is a cross sectional view illustrating a semiconductor memory device according to a preferred embodiment of the present invention, and FIG. 6 is a view illustrating an equivalent circuit of the semiconductor memory device as shown in FIG. 5. This semiconductor memory device prevents the loss of the cell data and reduces the standby current $I_{sb}$.

As shown in FIG. 5, a first p-type well 302, an n-type well 303, and a second p-type well 304 are each formed on different portions of a p-type semiconductor substrate 301. A first n$^+$ doped impurity region 305 is embedded in the first p-type well 302 and is connected with an input/output pad 110. A second n$^+$ impurity doped region 306 and a p$^+$ impurity doped region 307 are embedded in the first p-type well 302, separate from the n$^+$ impurity doped region 305. Both the second n$^+$ impurity doped region 306 and the p$^+$ impurity doped region 307 are connected with ground voltage $V_{SS}$. A third n$^+$ impurity doped region 308 is embedded in the n-type well 303 and is also connected to the ground voltage $V_{SS}$. A fourth embedded n$^+$ impurity doped region 309 is embedded in the second p-type well 304 and is connected with the cell node.

During operation, when undershoot is generated in a signal applied to the input/output pad 110 to forwardly bias the diode of the n$^+$ doped region 305 in the first p-type well 302, most electrons are injected into the first p-type well 302.

In the second conventional device disclosed above, the n-type well 303 has the source voltage $V_{CC}$ applied to it via the third n$^+$ doped region 308. This reversely biases the first p-type well 302 and n-type well 303 causing injected electrons to drift through the path 300B in the n-type well 303, thereby causing operational failure as a standby current $I_{sb}$. However, in the current invention, since the n-type well 303 has the ground voltage $V_{SS}$ applied to it, most of the injected electrons are discharged to the second p-type well 304 and the remaining electrons are discharged to the n-type well 303, which is also connected to the ground voltage $V_{SS}$.

Figure 7:
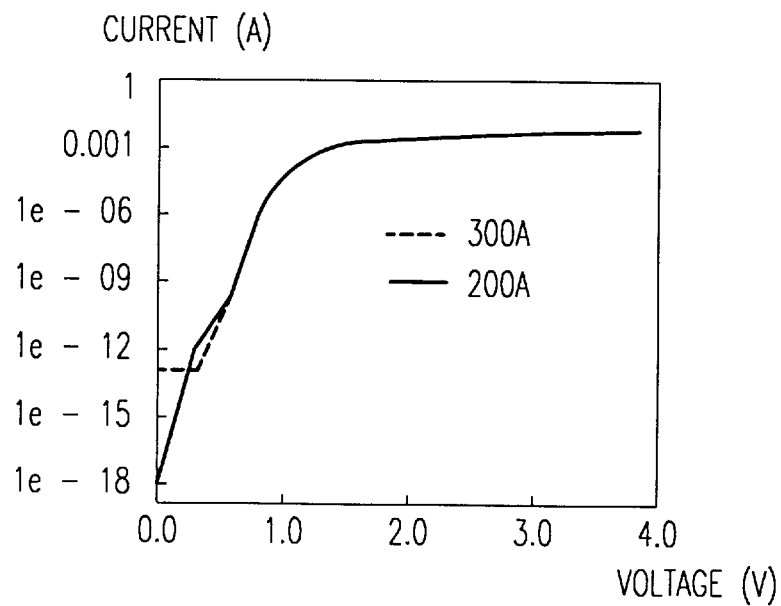
FIG. 7 is a graph illustrating the voltage characteristics against the current in the p-type well of the semiconductor memory device as shown in FIG. 5.
Figure 8:
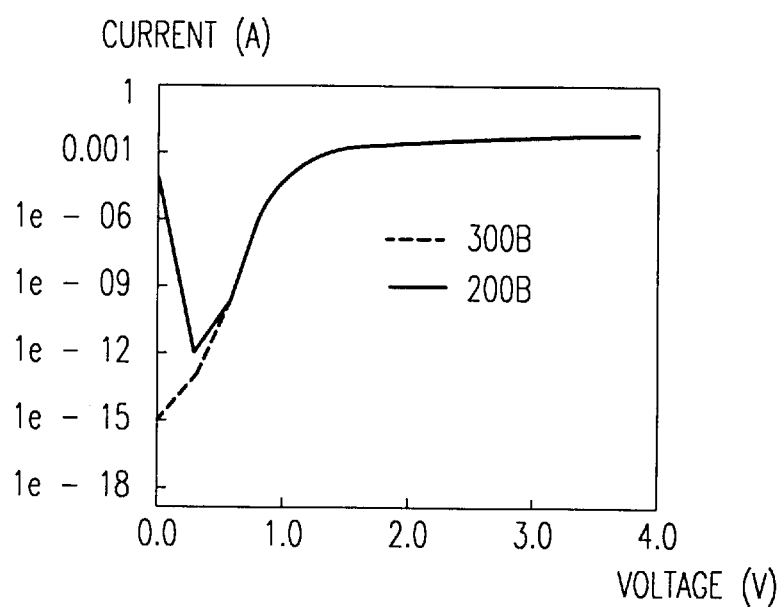
FIG. 8 is a graph illustrating the voltage characteristics against the current in the n-type well of the semiconductor memory device as shown in FIG. 5.
Figure 9:
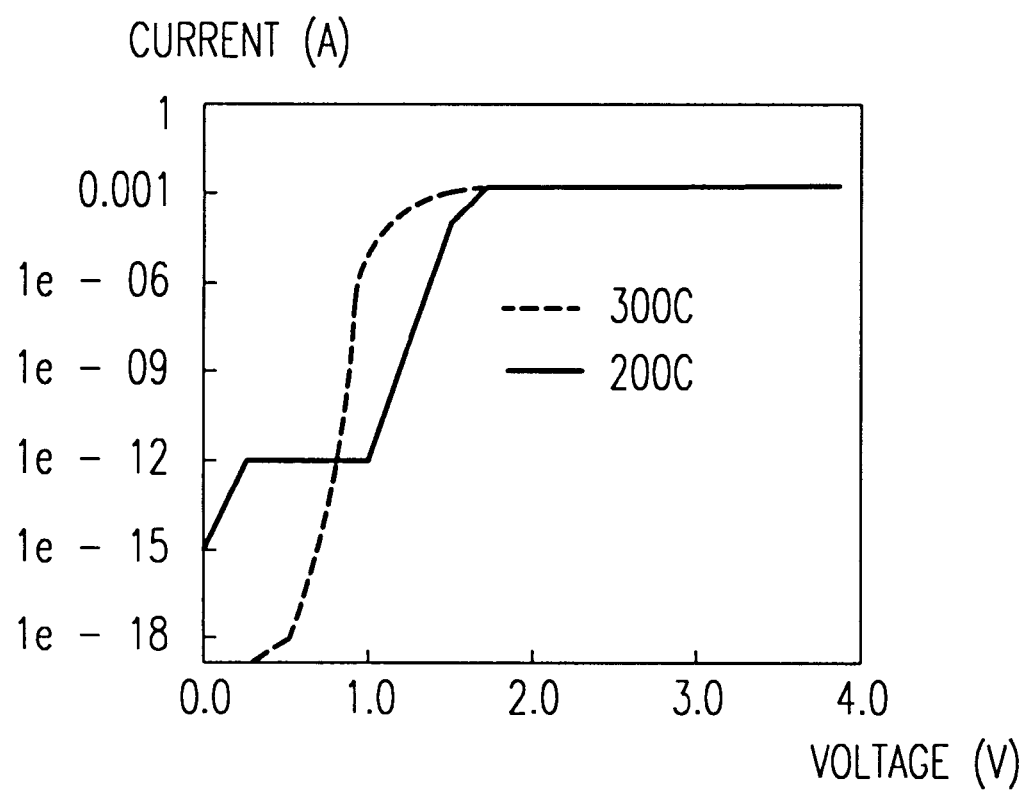
FIG. 9 is a graph illustrating the voltage characteristics against the current in the substrate of the semiconductor memory device as shown in FIG. 5.

FIGS. 7 to 9 illustrate the results obtained by a simulation of the memory device shown in FIG. 5. In particular, FIG. 7 is a graph illustrating the voltage characteristics against the current in the second p-type well 304 of the semiconductor memory device as shown in FIG. 5. FIG. 8 is a graph illustrating the voltage characteristics against the current in the n-type well 303 of the semiconductor memory device as shown in FIG. 5, and FIG. 9 is a graph illustrating the voltage characteristics against the current in the substrate 301 of the semiconductor memory device as shown in FIG. 5. In these graphs, the ground voltage $V_{SS}$ is 0V and the source voltage $V_{CC}$ is 5V.

As can be seen in the above FIGS. 7 to 9, the present invention prevents electrons from flowing from the first p-type well 302 to the n-type well 303 by grounding the n-type well 303. Accordingly, this invention can reduce the the standby current $I_{sb}$ by applying the ground voltage $V_{SS}$ to the n-type well 303. This also prevents electrons from flowing to the cell array and influencing the cell data.

While there have been illustrated and described what are considered to be preferred embodiments of the present invention, it will be understood by those skilled in the art that various changes and modifications may be made, and equivalents made be substituted for the disclosed elements without departing from the true scope of the present invention. In addition, many modifications may be made to adapt a particular situation to the teaching of the present invention without departing from the central scope of the invention. Therefore, it is intended that the present invention not be limited to the particular embodiments disclosed as the best mode contemplated for carrying out the present invention, but that the present invention includes all embodiments falling within the scope of the appended claims.

What is claimed is:

1. A semiconductor memory device, comprising:
    a first conductivity type semiconductor substrate connected to a ground voltage;

a first well region of second conductivity type formed over the semiconductor substrate and connected to the ground voltage;

a second well region of the first conductivity type embedded in the first well region;

a first impurity region of the second conductivity type embedded in the second well region and connected to an input/output pad;

one or more additional impurity regions embedded in the second well region separately from the first impurity region, the one or more additional impurity regions being connected to the ground voltage; and a second impurity region of the second conductivity type embedded in the first well region, connected to the ground voltage, wherein the one or more additional regions include a third impurity region of the first conductivity type and a fourth impurity region of the second conductivity type.

2. A semiconductor memory device, comprising:

a first conductivity type semiconductor substrate connected to a ground voltage;

a first well region of second conductivity type formed over the semiconductor substrate and connected to the ground voltage;

a second well region of the first conductivity type embedded in the first well region;

a first impurity region of the second conductivity type embedded in the second well region and connected to an input/output pad;

one or more additional impurity regions embedded in the second well region separately from the first impurity region, the one or more additional impurity regions being connected to the ground voltage;

a second impurity region of the second conductivity type embedded in the first well region, connected to the ground voltages;

a third well region of the first conductivity type formed over the semiconductor substrate; and a fifth impurity region of the second conductivity type formed in the third well region and connected to a cell node.

3. A semiconductor memory device, comprising:

a semiconductor substrate of a first conductivity type connected to a ground voltage;

a first well region of a second conductivity type formed over the semiconductor substrate and connected to a power supply voltage;

a second well region of the first conductivity type embedded in the first well region;

a first impurity region of the second conductivity type embedded in the second well region and connected to an input/output pad;

one or more additional impurity regions embedded in the second well region separately from the first impurity region and connected to the power supply voltage; and a second impurity region of the second conductivity type embedded in the first well regions, connected to the power supply voltage, wherein the one or more additional impurity regions include a third impurity region of the first conductivity type and a fourth impurity region of the second conductivity type.

4. A semiconductor memory device, comprising:

a semiconductor substrate of a first conductivity type connected to a ground voltage;

a first well region of a second conductivity type formed over the semiconductor substrate and connected to a power supply voltage;

a second well region of the first conductivity type embedded in the first well region;

a first impurity region of the second conductivity type embedded in the second well region and connected to an input/output pad;

one or more additional impurity regions embedded in the second well region separately from the first impurity region and connected to the power supply voltage;

a second impurity region of the second conductivity type embedded in the first well region, connected to the power supply voltage;

a third well region of the first conductivity type formed over the semiconductor substrate; and a fifth impurity region of the second conductivity type formed in the third well region and connected to a cell node.

* * * * *